(12) United States Patent
Sunaga

(10) Patent No.: US 7,518,942 B2
(45) Date of Patent: Apr. 14, 2009

(54) SEMICONDUCTOR STORAGE DEVICE

(75) Inventor: Toshio Sunaga, Ohtsu (JP)

(73) Assignee: International Business Machines Corporation, Armonk, NY (US)

( * ) Notice: Subject to any disclaimer, the term of this patent is extended or adjusted under 35 U.S.C. 154(b) by 173 days.

(21) Appl. No.: 11/555,333

(22) Filed: Nov. 1, 2006

(65) Prior Publication Data

US 2007/0104012 A1    May 10, 2007

(30) Foreign Application Priority Data

Nov. 4, 2005    (JP)    ............... 2005-320982

(51) Int. Cl.
*G11C 8/00*    (2006.01)
(52) U.S. Cl. .............. 365/230.06; 365/230.03
(58) Field of Classification Search ............ 365/230.06, 365/207
See application file for complete search history.

(56) References Cited

U.S. PATENT DOCUMENTS

| 5,764,585 | A | * | 6/1998 | Matsubara | ............ | 365/230.06 |
| 5,859,802 | A | * | 1/1999 | Lee et al. | ................ | 365/200 |
| 6,252,794 | B1 | | 6/2001 | Sunaga et al. | | |
| 6,507,533 | B2 | * | 1/2003 | Sato | ............... | 365/230.03 |
| 6,930,943 | B2 | * | 8/2005 | Kim | ................ | 365/222 |

FOREIGN PATENT DOCUMENTS

| CN | 1142672 | 2/1997 |
| CN | 1191370 | 8/1998 |
| CN | 1195862 | 10/1998 |
| JP | PUPAH0383287 | 4/1991 |
| JP | PUPAH0442498 | 2/1992 |
| JP | PUPAH1117137 | 1/1999 |
| JP | 2000-021168 | 1/2000 |
| JP | 2002-184182 | 6/2002 |
| JP | 2002-269982 | 9/2002 |
| JP | PUPA 2003-217279 | 7/2003 |
| JP | 2005-108408 | 4/2005 |
| WO | WO99/54881 | 10/1999 |

OTHER PUBLICATIONS

ELPIDA—128 Mb Mobile RAM Specifications EDL 1216CASA, Published: Jun. 2002.

* cited by examiner

*Primary Examiner*—Anh Phung
(74) *Attorney, Agent, or Firm*—W. Riyon Harding

(57) ABSTRACT

The objective of the present invention is to provide a semiconductor storage device wherein a low active current is obtained by reducing the number of sense amplifiers to be activated at a time. An SDRAM has a divided word line structure, and includes a plurality of banks, each of which includes arrays AR1 to AR64 and 4K main word lines MWL. A row address signal is fetched in response to a row address strobe signal, and a segment address signal is fetched in response to a column address strobe signal. A main row decoder MRD activates main word lines MWL1, MWL5, MWL9 and MWL13 in response to the row address signal, and a segment row decoder SRD selects only an array AR1 in response to a segment address signal, and activates only 1K sense amplifiers SA corresponding to the selected array AR. When the main word lines MWL1, MWL5, MWL9 and MWL13 are activated, the segment word lines in arrays AR2 to AR64 are not activated, so that data are not destroyed.

10 Claims, 9 Drawing Sheets

SEMICONDUCTOR STORAGE DEVICE

FIELD OF THE INVENTION

The present invention relates to a semiconductor storage device, and more in particular to the improvement of a semiconductor storage device having a divided word line structure.

BACKGROUND OF THE INVENTION

SDRAM (Synchronous Dynamic Random Access Memory) is widely used as a general purpose memory for various products including personal computers. Recently, because of a variety of applications, new general purpose memories, in which the functions and performances have been modified for special usages, have been developed. A low current SDRAM is an example of such a product, and is used for a low-current battery operated product, such as a cellular phone or a PDA (Personal Digital Assistance). Furthermore, an SDRAM having a larger capacity (128 Mb or 256 Mb) than a conventional PSRAM (Pseudo Static Random Access Memory) has started to be used.

In this field, low standby and active currents are required at a slow clock speed such as 100 MHz, which is also lower than that for a general purpose SDRAM. Performance is also low, for example, the access time is 56 ns and the CAS latency is three clocks (26 ns).

Furthermore, the low current SDRAM exploits the same four-bank scheme as the general-purpose SDRAM. The four-bank scheme activates many sense amplifiers at a time and operates many arrays, so that the performance of the low current SDRAM once dropped by a slow clock can be enhanced by multiple accesses through bank activation. Generally, since each I/O activates 512 to 1024 sense amplifiers, a chip with 16 I/Os needs to fire 8K to 16K sense amplifiers in a single access. Thus, it is difficult to reduce the active current that is significantly larger than that of PSRAM.

FIG. 11 shows the typical layout of a low-current 256-Mb SDRAM 1. The SDRAM 1 has four banks, BNK0 to BNK3, and 16 I/Os. The individual bank consists of 32 arrays (ARs), each of which has 1K word lines, 2K bit line pairs and 2K sense amplifiers. Therefore, the individual array has 2M bit cells. To make the 1K-word page size accessible by column addresses, each bank access must fire 16 sense amplifiers. Thus, one row access needs to activate eight arrays, ARs.

As described above, the conventional SDRAM 1 activates many sense amplifiers at a time. Firing sense amplifiers charges up capacitors of the same number of bit line pairs, and the major part of active currents stems from this charging current.

SUMMARY OF THE INVENTION

One objective of the present invention is to provide a semiconductor storage device wherein a low active current is obtained by reducing the number of sense amplifiers to be activated at a time.

A semiconductor storage device according to the present invention comprises: a plurality of arrays, I/O line pairs, a plurality of main word lines, a main row decoder, a plurality of sense amplifier groups, partial activation means and a column decoder. Each of the arrays includes a plurality of memory cells, a plurality of segment word lines and a plurality of bit line pairs. The memory cells are arranged in rows and columns, and the segment word lines are arranged in rows. The bit line pairs are arranged in columns, and the I/O line pairs are provided in correlation with the arrays. The main word lines are arranged in rows across the arrays, and the main row decoder activates main word lines in response to a row address signal. The sense amplifier groups are located corresponding to the arrays, and are connected to the bit line pairs of the corresponding arrays. The partial activation means selects one of the arrays in response to a segment address signal received together with a column address signal, and activates a sense amplifier group corresponding to the selected array. The column decoder connects the bit line pair to the I/O line pair in response to the column address signal.

According to the semiconductor storage device, when the main row decoder has activated the main word lines, the partial activation means selects not all of the arrays, but only a specific array, and further, activates only a sense amplifier group corresponding to the selected array. Therefore, the scheme reduces an active current by firing fewer sense amplifiers at a time. The segment word lines in the unselected arrays remain idle, although the main row decoder activates the main word lines. Thus, the unselected array data are not destroyed when this partial activation scheme does not fire sense amplifiers in those arrays.

Preferably, during a period in which the main row decoder is activating main word lines, the partial activation means selects a first array from the arrays in response to a first segment address signal, activates a sense amplifier group corresponding to the selected first array, selects a second array which differs from the first array in response to a second segment address signal that is different from the first segment address signal, and activates a sense amplifier group corresponding to the selected second array.

In this embodiment, since a single row access executes multiple column accesses, multiple burst operations occur. Preferably, a pre-charge command deactivates the selected main word lines. It also terminates the partial activation operation by restoring sense amplifiers.

The semiconductor storage device further comprises: an address buffer and a column address timing control circuit. The address buffer fetches an externally input address signal as a row address signal in response to a row address strobe signal, or fetches an externally input address signal as a column address signal and a segment address signal in response to a column address strobe signal. The column address timing control circuit provides the segment address signal fetched in the address buffer to the partial activation means, and provides the column address signal fetched from the address buffer to the column decoder.

Preferably, the partial activation means includes a segment row decoder and sense amplifier control means. The segment row decoder activates segment word lines in response to the segment address signal. The sense amplifier control means activates a sense amplifier group corresponding to an array that includes the segment word lines activated by the segment row decoder.

The semiconductor storage device preferably includes a plurality of banks and bank selection means. The bank selection means selects one of the banks in response to a bank address signal. Each of the banks has a configuration corresponding to that of the above described semiconductor storage device.

During a period in which the bank selection means selects a second bank and then again selects a first bank, the main row decoder in the first bank selected by the bank selection means maintains the main word lines in the activated state.

In this embodiment, a bank interleave operation for alternately accessing different banks can be performed.

DETAILED DESCRIPTION OF THE INVENTION

Figure 1:
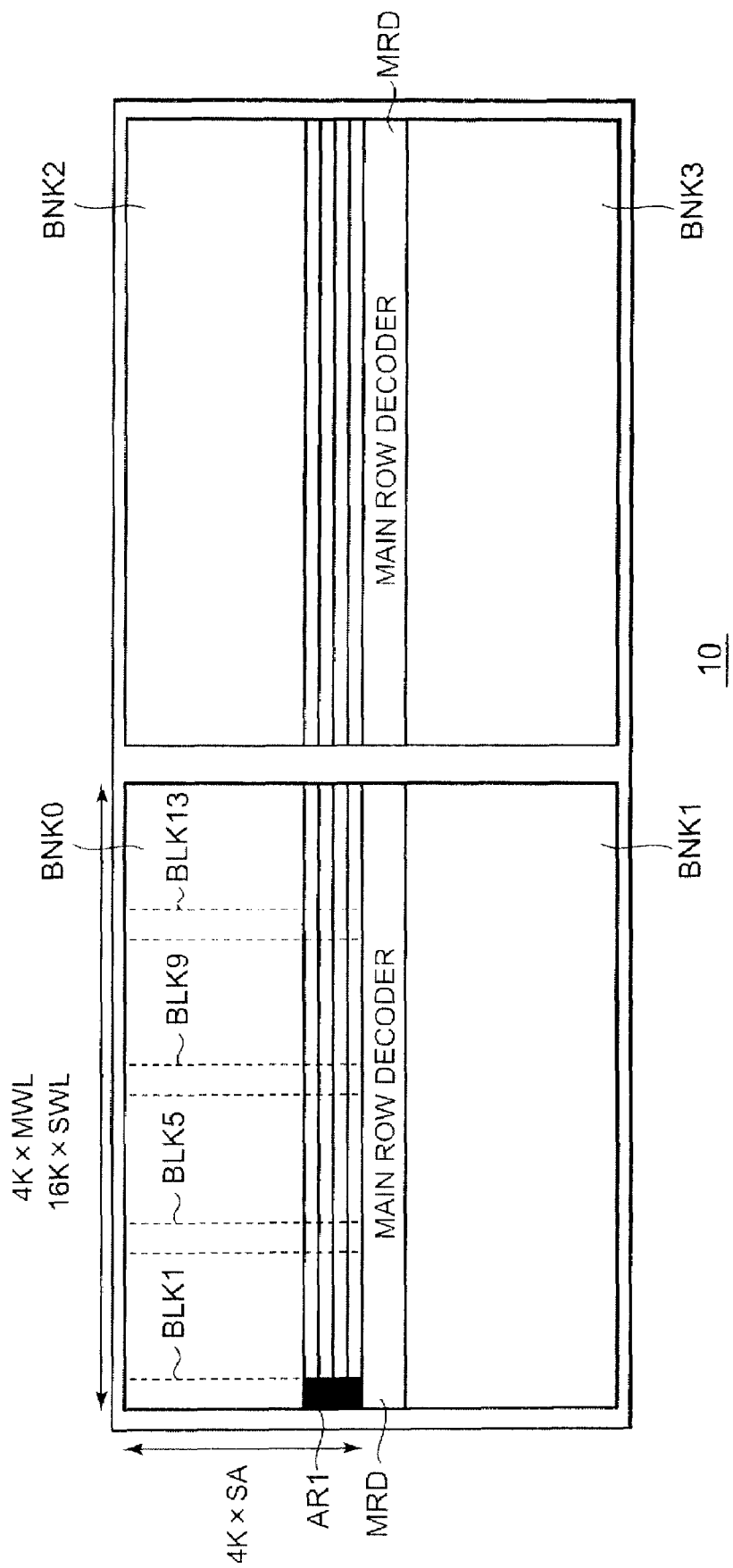
FIG. 1 is a layout diagram showing the general configuration of an SDRAM according to one embodiment of the present invention.

Referring to the drawings, the preferred embodiment of the present invention will now be described in detail. The same reference numerals are provided for identical or corresponding portions in the figures, and an explanation for them will not be repeated. Further, a logical high level is denoted by "H level" and a logical low level is denoted by "L level".

Referring to FIG. 1, an SDRAM 10 according to the embodiment of the present invention has four banks BNK0 to BNK3. Main row decoders MRD are arranged between the banks BNK0 and BNK1 and between the banks BNK2 and BNK3. Each of the banks BNK0 to BNK3 has a divided word line structure that includes main word lines MWL arranged in 4K rows and segment word lines SWL arranged in 16K rows. Each of the banks BNK0 to BNK3 also has bit line pairs (not shown) arranged in 4K columns and sense amplifiers SA connected to these bit line pairs. Each of the banks BNK0 to BNK3 comprises memory cells arranged in 16K rows and 4K columns. Therefore, each of the banks BNK0 to BNK3 has a memory capacity of 64 Mb and SDRAM 10 has a memory capacity of 256 Mb.

Figure 2:
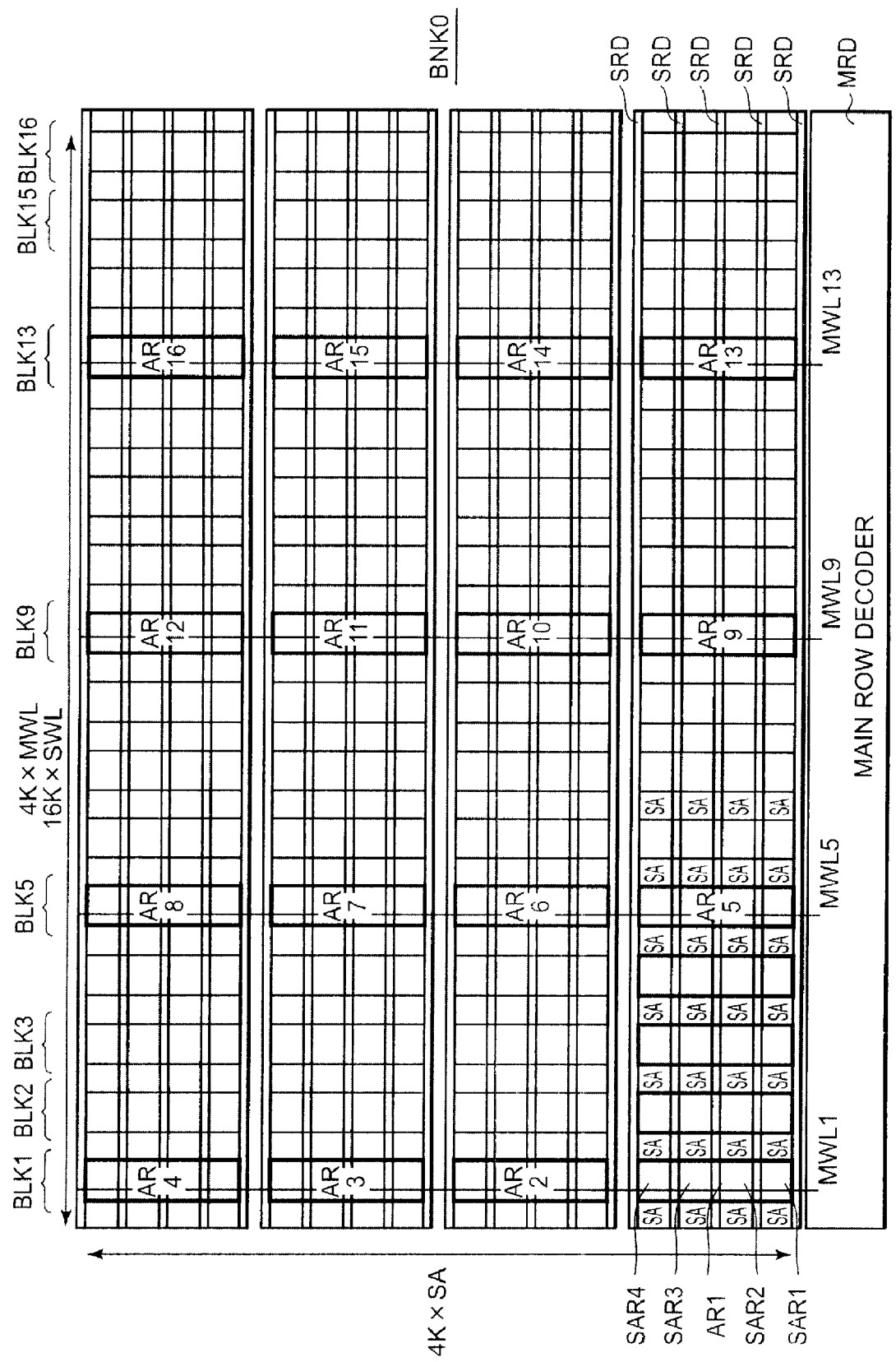
FIG. 2 is a layout diagram showing a typical structure of one bank in FIG. 1.

FIG. 2 shows the detail of the bank BNK0 as a representative example.

Referring to FIG. 2, the bank BNK0 consists of 64 arrays AR1 to AR64 in 16 rows and 4 columns. The bank BNK0 includes 4K main word lines MWL. The main word lines MWL made of aluminum, copper or the like are formed on a first metal layer, and extend across four arrays (e.g., AR1 to AR4) located in each row. The four arrays located in each row form one array block, and the bank BNK0 is composed of 16 array blocks BLK1 to BLK16.

In response to a row address signal, the main row decoder MRD selects and activates four main word lines, out of the 4K main word lines MWL, for example, MWL1 for array block BLK1, MWL5 for array block BLK5, MWL91 for array block BLK9 and MWL13 for array block BLK13.

Figure 3:
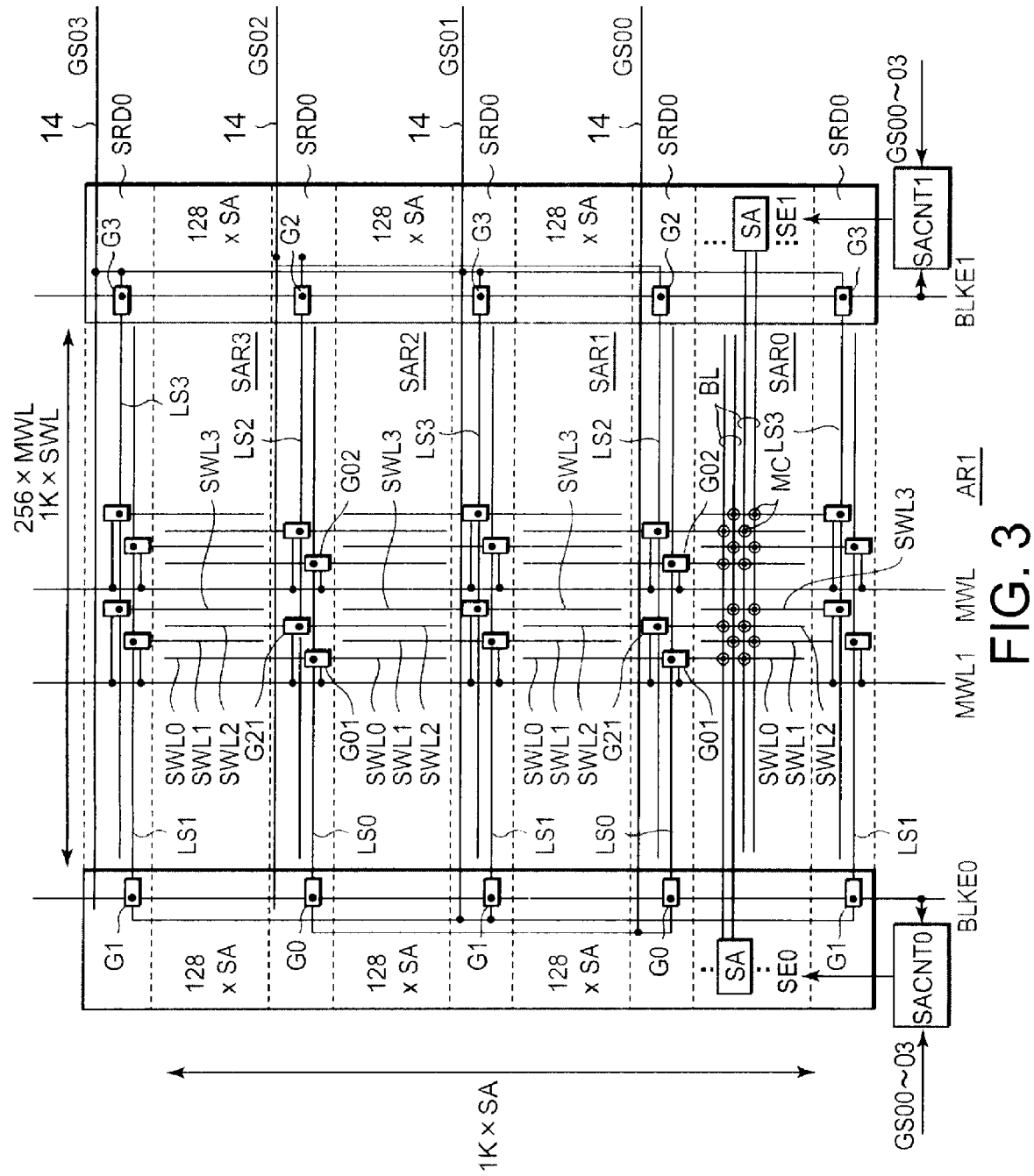
FIG. 3 is a layout diagram showing a typical structure of one array in FIGS. 1 and 2.

FIG. 3 shows the detail of the array AR1 as a representative example. Referring to FIG. 3, the array AR1 is divided into four sub-arrays SAR1 to SAR4. Each of the sub-arrays SAR1 to SAR4 includes 256 memory cells MC arranged in rows and columns, 1K segment word lines SWL arranged in rows, and 256 bit line pairs BL arranged in columns. Therefore, each of the sub-arrays SAR1 to SAR4 has a memory capacity of 256 Kb.

256 main word lines MWL vertically extend across all of the four sub-arrays SAR1 to SAR4. For each sub-array SAR, four segment word lines SWL are arranged per one main word line MWL. Therefore, 4K segment word lines SWL are arranged for the entire array AR1. The segment word lines SWL are formed, for example, of poly silicon.

Segment row decoders SRD0 are positioned on the upper side and the lower side of the sub-arrays SAR1 to SAR4 as shown in FIG. 3. The segment row decoders SRD0 selectively activate the segment word lines SWL.

Sense amplifiers SA are provided on the left side and the right side of the sub-arrays SAR1 to SAR4, such that 128 sense amplifiers SA are arranged on each side and total 256 sense amplifiers SA. Therefore, 256 bit line pairs BL are connected to the 256 sense amplifiers SA. Thus, 1K sense amplifiers SA are arranged as a sense amplifier group in the entire array AR1, and 4K sense amplifiers SA are provided in the entire array block BLK1.

A sense amplifier control circuit SACNT0 is located near to the 512 sense amplifiers SA arranged on the left side of the array AR1 in FIG. 3, while a sense amplifier control circuit SACNT1 is located near to the 512 sense amplifiers SA arranged on the right side of the array AR1 in FIG. 3. The sense amplifier control circuit SACNT0 generates a sense amplifier enable signal SE0 that activates all of the corresponding 512 sense amplifiers SA at a specified time. The sense amplifier control circuit SACNT1 generates a sense amplifier enable signal SE1 that activates all of the corresponding 512 sense amplifiers SA at a specific time. The detailed description thereof will be given later.

Figure 4:
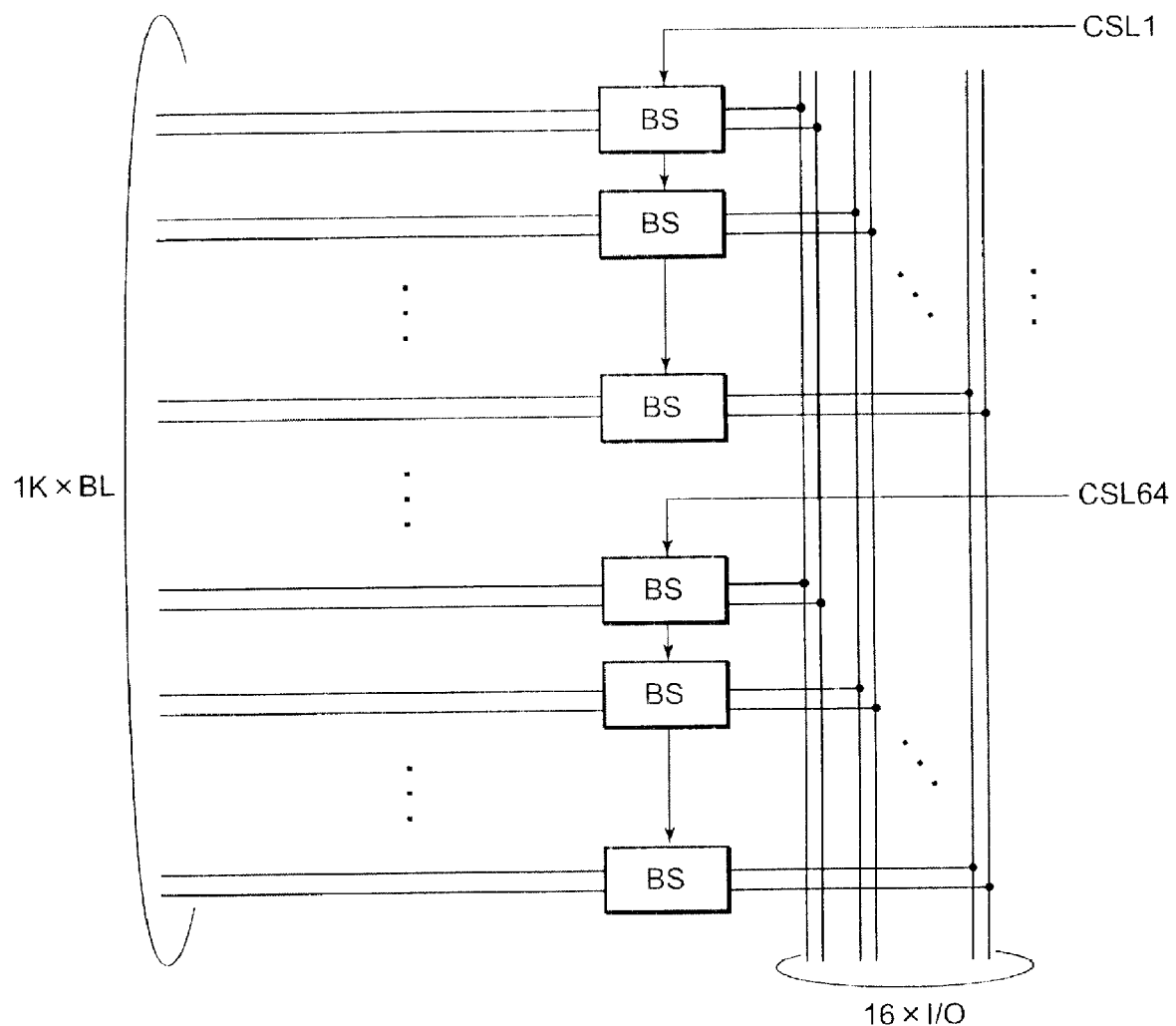
FIG. 4 is a functional block diagram showing the arrangement of the periphery of bit line pairs in FIG. 3.

Referring to FIG. 4, 1K bit line pairs BL are arranged for the entire array AR1, and 1K bit switches BS are also provided. The 1K bit line pairs BL are connected, in 16 bit line pair groups, to 16 I/O line pair I/Os. 64 column selection lines CSL1 to CSL64 are arranged for the entire bank BNK0 so as to intersect the main word lines MWL and are connected to the corresponding 16 bit switches BS.

Figure 5:
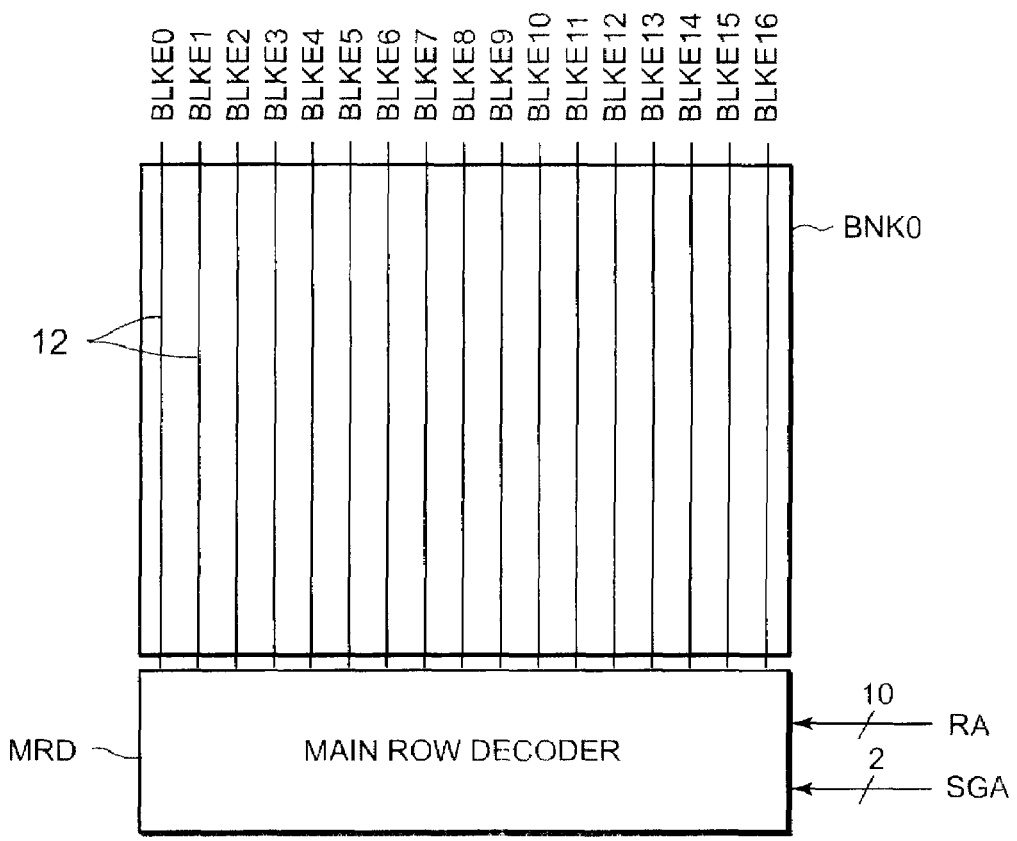
FIG. 5 is a layout diagram showing the structure of block selection lines in a bank in FIG. 2.

Referring to FIG. 5, 17 block selection lines 12 are arranged along the main word lines MWL in the entire bank BNK0. Specifically, a block selection line 12 is located on each side of each of the array blocks BLK1 to BLK16 in FIGS. 1 and 2. The block selection lines 12 are connected to the main row decoder MRD. The main row decoder MRD generates block enable signals BLKE0 to BLKE 16 in response to a row address signal RA and a segment address signal SGA (described later in detail). Specifically, the main row decoder MRD activates two of the 17 block enable signals BLKE0 to BLKE 16, which are arranged on the both sides of the array block that is to be selected.

Figure 6:
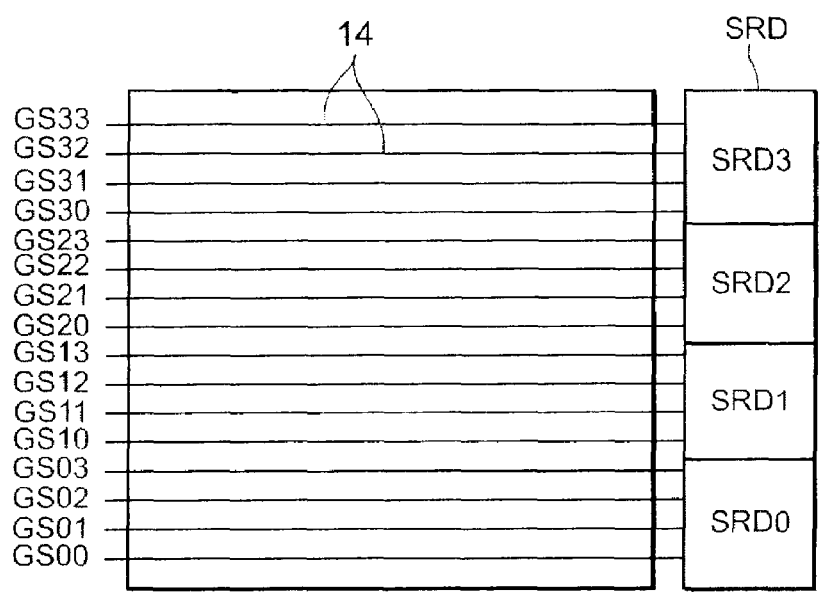
FIG. 6 is a layout diagram showing the structure of segment selection lines in a bank shown in FIG. 2.

Referring to FIG. 6, 16 global segment selection lines 14 are arranged across the bit line pairs BL in the entire bank BNK0, and are connected to the segment row decoder SRD, which generates global segment selection signals GS00 to GS33 in response to a segment address signal. The segment row decoder SRD is divided into four segment row decoders SRD0 to SRD3. The segment row decoder SRD0 activates one of four corresponding global segment selection signals GS00 to GS03. The other segment row decoders SRD1 to SRD3 function similarly. As shown in the array AR1 of FIG. 3, four global segment selection lines 14 extend transversely to transmit global segment selection signals GS00 to GS03.

Figure 7:
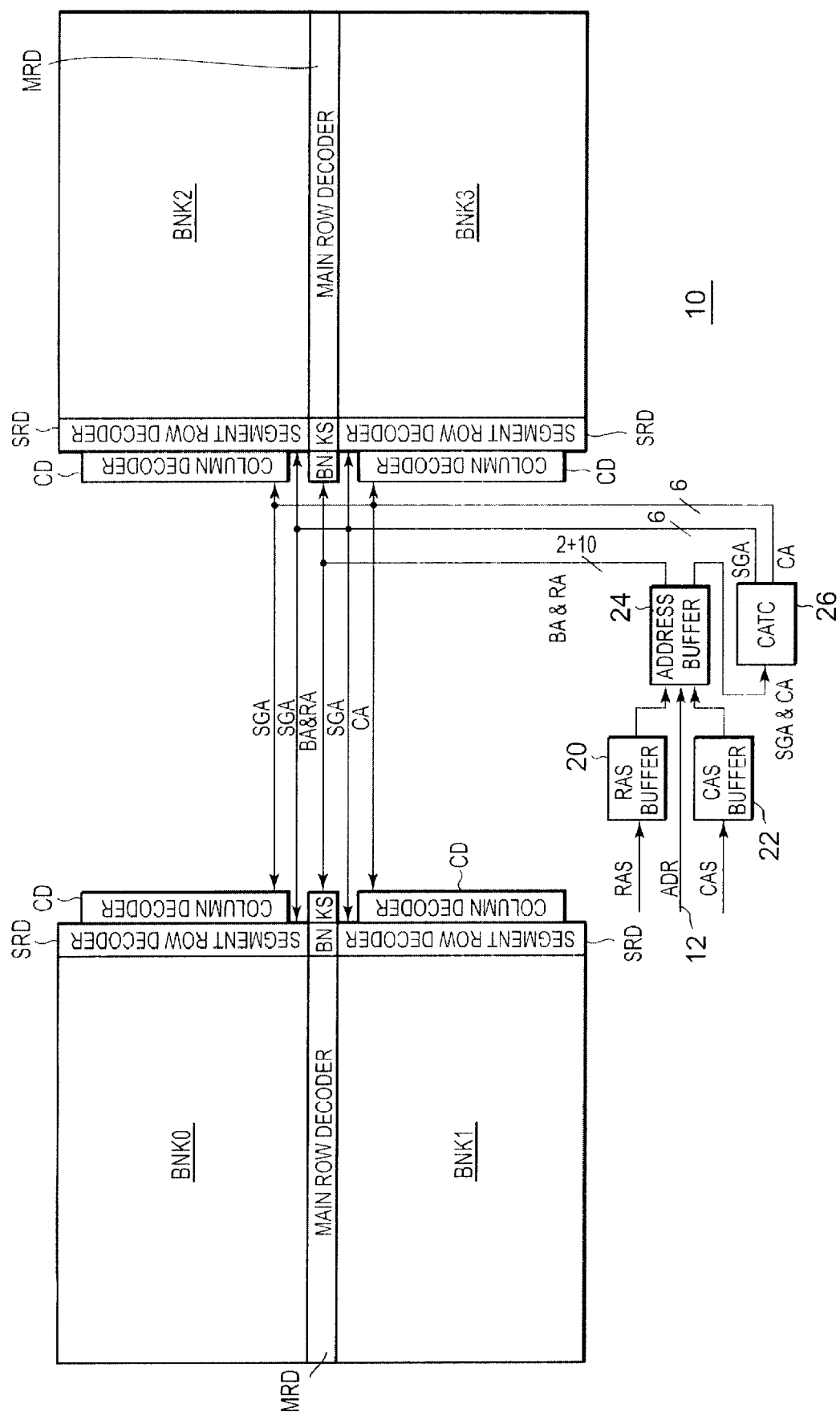
FIG. 7 is a functional block diagram showing the general configuration of the SDRAM shown in FIG. 1.

Referring to FIG. 7, the SDRAM 10 also has an RAS buffer 20, a CAS buffer 22, an address buffer 24, a column address timing control circuit (CATC) 26, a bank selector BNKS and column decoders CD.

The RAS buffer 20 fetches an externally input row address strobe signal RAS, and the CAS buffer 22 fetches an external input column address strobe signal CAS. The address buffer 24 fetches an externally input 12-bit address signal ADR in response to the row address strobe signal RAS as a row address signal, and provide the same to the bank selector BNKS and the main row decoders MRD. Further, the address buffer 24 also fetches an externally input 12-bit address signal ADR in response to a column strobe signal CAS, as a column address signal and a segment address signal, and provides the same to CATC 26.

The 12-bit address signal ADR, fetched in response to the row address strobe signal RAS, includes a 2-bit bank address signal BA and a 10-bit row address signal RA. The 12-bit address signal ADR, fetched in response to the column address strobe signal CAS, includes a 6-bit segment address signal SGA and a 6-bit column address signal CA.

The bank selector BNKS selects one of the four banks BNK0 to BNK3, in response to the 2-bit bank address signal BA received from the address buffer 24. The main row decoder MRD activates four of the 4K main word lines MWL present in the bank that is selected by the bank selector BNKS, in response to the 10-bit row address signal RA received from the address buffer 24.

Figure 8:
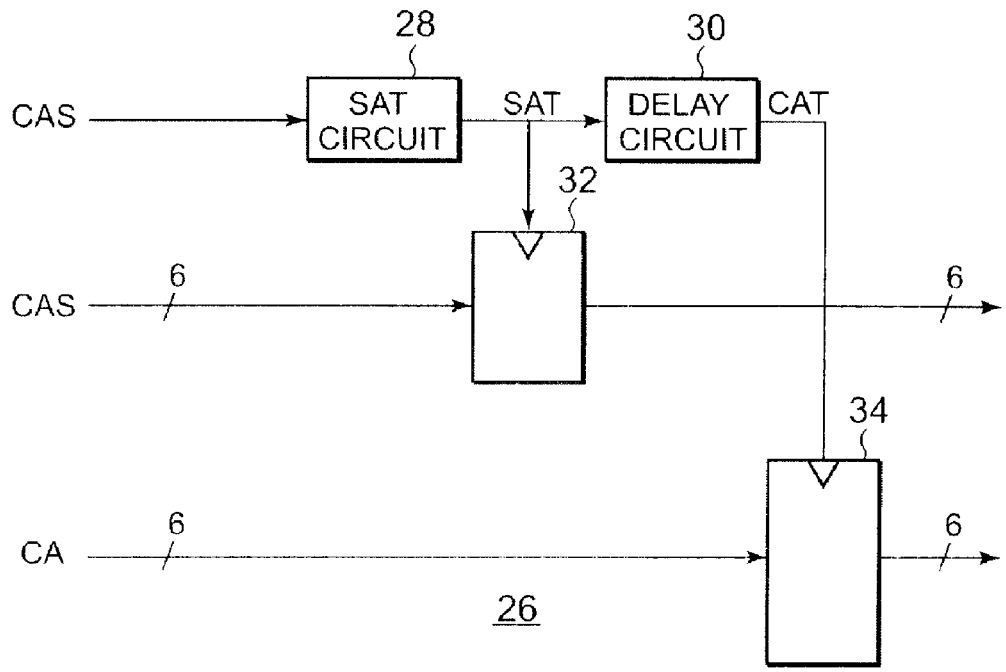
FIG. 8 is a functional block diagram showing the typical arrangement of a column address timing control circuit (CATC) of FIG. 7.

Referring to FIG. 8, CATC 26 includes: a SAT circuit 28 for generating a segment address timing signal SAT in response to a column address strobe signal CAS; a delay circuit 30 for delaying the segment address timing signal SAT and generating a column address timing signal CAT; a latch circuit 32 for latching a 6-bit segment address signal SGA in response to the segment address timing signal SAT; and a latch circuit 34 for latching a 6-bit column address signal CA in response to the column address timing signal CAT.

CATC 26 first provides the 4-bit segment address signal SGA received from address buffer 24 to the segment row decoder SRD, and provides the 2-bit segment address signal SGA to the main row decoder MRD. CATC 26 provides the 6-bit column address signal CA received from address buffer 24 to the column decoder CD, after the segment address signal SGA has been provided.

The segment row decoder SRD activates one of the 16 global segment selection signals GS00 to GS33 in response to the 4-bit segment address signal SGA. Specifically, the segment row decoder SRD selects one of the segment row decoders SRD0 to SRD3, for example, the segment row decoder SRD0 in this embodiment, in response to the 2-bit segment address signal SGA. The selected segment row decoder SRD0 selects one of the global segment selection signals GS00 to GS03, in response to another 2-bit segment address signal SGA.

The main row decoder MRD activates two of the 17 block enable signals BLKE0 to BLKEL16, in response to the 10-bit row address signal RA and the 2-bit segment address signal SGA. In this embodiment, the main row decoder MRD activates the block enable signals BLKE0 and BLKEL present on both sides of the array block BLKE1 to which the array AR1 belongs, among the four array blocks BLK1, BLK5, BLK9 and BLK13 to which the four activated main word lines MWL1, MWL5, MWL9 and MWL13 belong.

Figure 9:
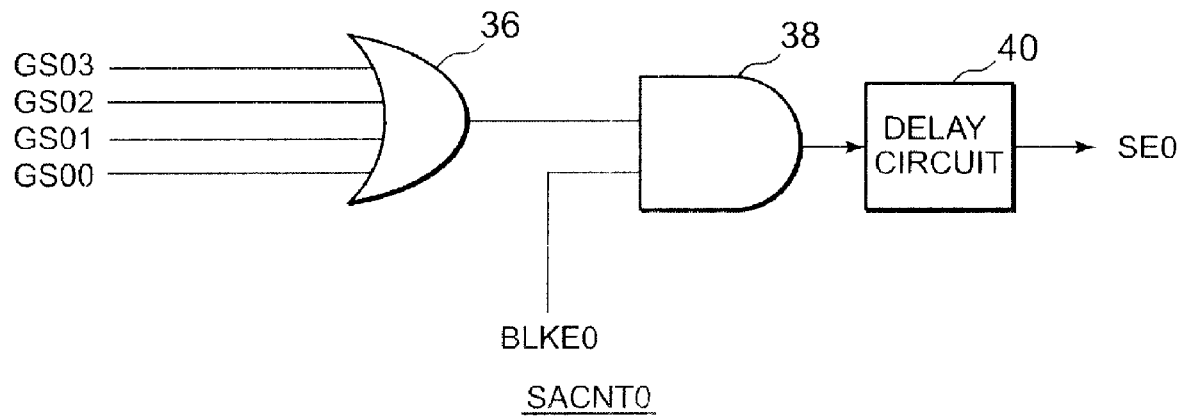
FIG. 9 is a functional block diagram showing the typical arrangement of a sense amplifier control circuit of FIG. 3.

Referring to FIG. 9, the sense amplifier control circuit SACNT0 includes: an OR circuit 36 for receiving corresponding global segment selection signals GS00 to GS03; an AND circuit 38 for receiving a signal output by OR circuit 36 and the corresponding block enable signal BLKE0; and a delay circuit 40 for delaying a signal output by AND circuit 38 and generating a sense amplifier enable signal SE0. The other sense amplifier control circuit is similarly arranged.

Each of the column decoders CD activates one of 64 column selection lines CSL1 to CSL64 in response to the 6-bit column address signal CA. When a column selection line is activated, 16 corresponding bit switches BS are turned on, and 16 corresponding bit line pairs BL are connected to 16 corresponding I/O line pair I/Os.

Figure 10:
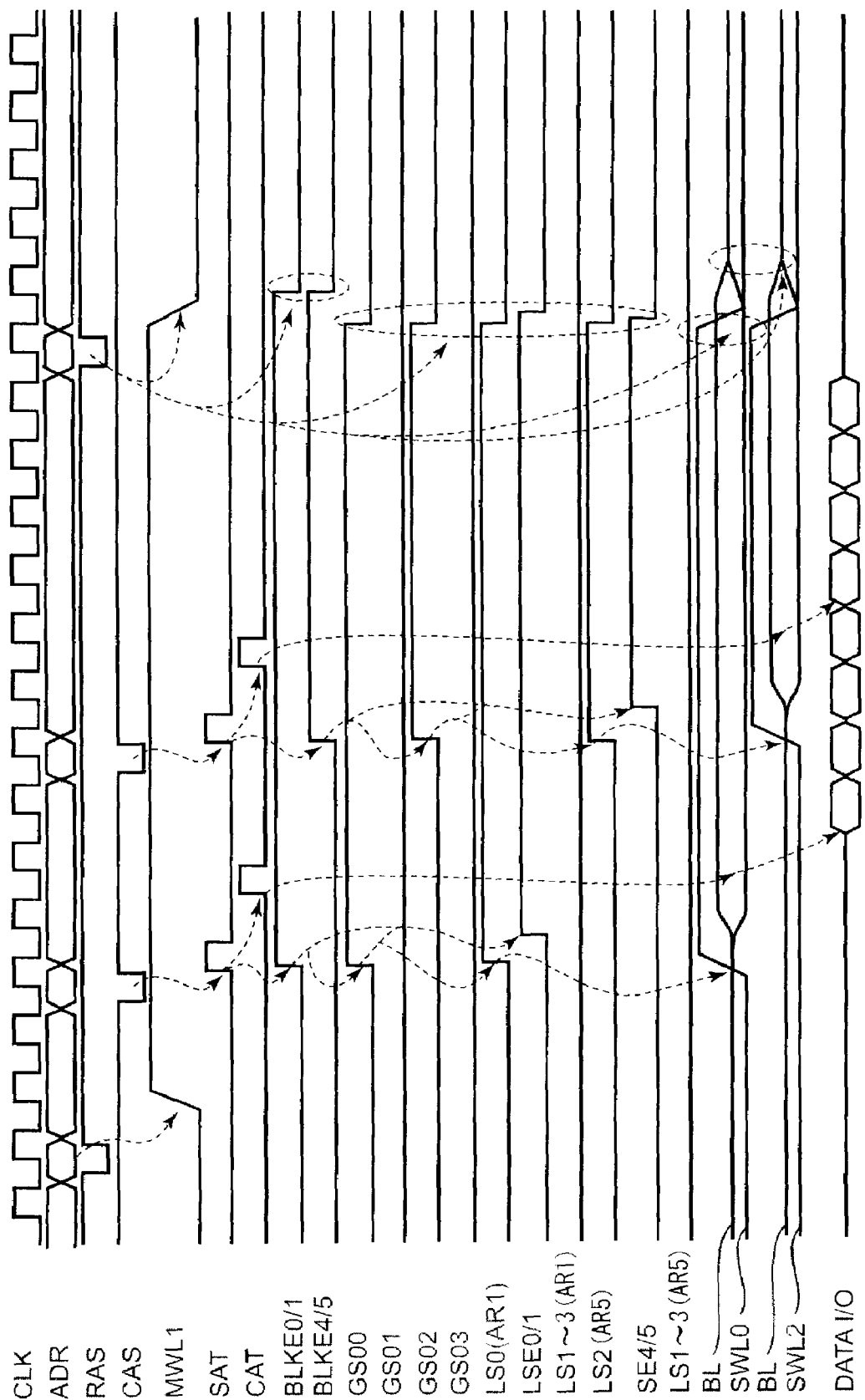
FIG. 10 is a timing chart showing an example operation of the SDRAM shown in FIGS. 1 to 9.
Figure 11:
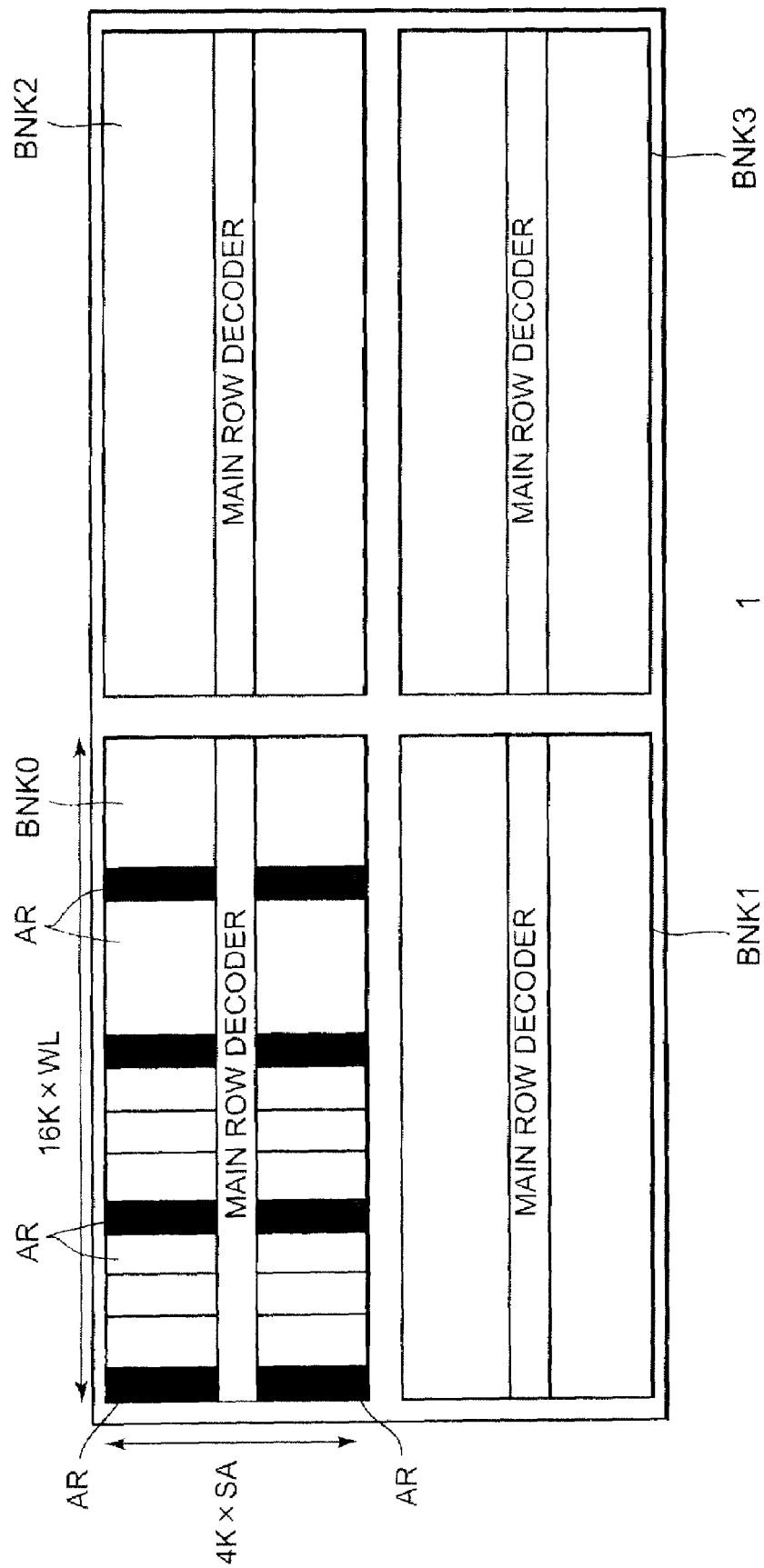
FIG. 11 is a layout diagram showing the general configuration of a conventional SDRAM.

The operation of the SDRAM 10 will now be described with reference to FIG. 10.

The operation of the SDRAM 10 operates synchronously with a clock signal CLK. Address buffer 24 fetches the address signal ADR in response to the row address strobe signal RAS, and provides the signal ADR as a bank address signal BA and a row address signal RA to the bank selector BNKS and the main row decoders MRD. The bank selector BNKS selects one of the banks BNK0 to BNK3 in response to a bank address signal BA, and provides a row address signal to the main row decoder MRD corresponding to the selected bank. The case in which the bank BNK0 is selected is explained by way of an example below.

The main row decoder MRD activates four main word lines MWL of the 4K main word lines MWL in the selected bank BNK0 in response to the row address signal RA. An explanation will now be given for the case in which the main row decoder MRD activates the main word lines MWL1, MWL5, MWL9 and MWL13.

After three clocks have elapsed from the input of the row address strobe signal RAS, address buffer 24 fetches the address signal ADR in response to the column address strobe signal CAS, and provides the signal ADR as a segment address signal SGA and a column address signal CA to CATC 26.

In CATC 26 shown in FIG. 8, SAT circuit 28 generates a segment address timing signal SAT, in response to the column address strobe signal CAS. Delay circuit 30 delays the segment address timing signal SAT for a predetermined period of time, and generates a column address timing signal CAT. When the segment address timing signal SAT is activated, latch circuit 32 provides two bits of the 6-bit segment address signal SGA for the main row decoder MRD, and provides the remaining four bits for the segment row decoder SRD.

The main row decoder MRD activates two of the 17 block enable signals BLKE0 to BLKE16 in response to the 10-bit row address signal and the 2-bit segment address signal SGA. For example, in the case in which the array AR1 is selected, the main row decoder MRD activates the block enable signals BLKE0 and BLKE1 present on both sides of the array block BLK1 to which the array AR1 belongs.

When the main row decoder MRD has activated the block enable signals BLKE0 and BLKE1, the segment row decoder SRD0 corresponding to the array AR1 activates one of the four global segment selection signals GS00 to GS03, for example, the global segment selection signal GS00 in this embodiment, in response to the segment address signal SGA.

Since the block enable signal BLKE0 has been activated, two AND circuits G0 included in the segment row decoder SRD0 activate two local segment selection signals LS0, respectively, in response to the global segment selection signal GS00. As a result, the two AND circuits G01 of the segment row decoder SRD0 activate four corresponding segment word lines SWL0, in response to the main word lines MWL1 and the local segment selection signals LS0 that are activated. The four segment word lines SWL0 to be activated are provided for each of the sub-arrays SAR1 to SAR4 and are arranged in one row along the main word line MWL1.

When the four segment word lines SWL1 are activated, data are read out to the 1K bit line pairs BL from 1K memory cells MC connected to these word lines SWL1. There is a potential difference which may occur between the individual bit line pairs BL.

The sense amplifier control circuit SACNT0 shown in FIG. 9 activates the sense amplifier enable signal SE0 after a predetermined period has elapsed following the activation of the block enable signal BLKE0 and the global segment selection signal GS00. At the same time, the sense amplifier control circuit SACNT1 also activates the sense amplifier enable signal SE1. Therefore, the 1K sense amplifiers SA corresponding to the array AR1 are activated. The 1K sense amplifiers SA then amplify the potential difference that occurs between the 1K bit line pairs BL, and latch 1K bits of the data that are read.

When the column address timing signal CAT is activated after the predetermined time has elapsed following the activation of the segment address timing signal SAT, the latch circuit 34 shown in FIG. 8 provides the 6-bit column address signal CA to the column decoders CD. Each of the column decoders CD activates one of the 64 column selection lines CSL1 to CSL64, in response to the 6-bit column address signal CA. As a result, the 16 bit switches BS connected to the activated column selection line are turned on, and 16 bits of data (one word) are transferred to the 16 I/O line pairs and are output. In this embodiment, the column address signal CA is toggled, and bursting of data for four words is performed.

When the column address strobe signal CAS is again activated following activation of the column address timing signal CAT, the main row decoder MRD activates, for example, the block enable signals BLKE4 and BLKE5, present on both sides of the array block BLK5 to which the array AR5 belongs.

When the main row decoder MRD have activated the block enable signals BLKE4 and BLKE5, the segment row decoder SRD0 corresponding to the array AR5 activates one of the four global segment selection signals GS00 to GS03, for example, the global segment selection signal GS02 in this embodiment, in response to the segment address signal SGA.

For the array AR5, in the same manner as described above, two AND circuits G2 included in the segment row decoder SRD0 activate two local segment selection signals LS2 each, in response to the global segment selection signal GS02. As a result, the two AND circuits G2 of the segment row decoders SRD0 activate four corresponding segment word lines SWL2, in response to the main word line MWL1 and the local segment selection signal LS2 that are activated.

After a predetermined period has elapsed following the activation of the block enable signals BLKE4 and BLKE5 and the global segment selection signal GS02, the sense amplifier enable signals SE4 and SE5 are activated. As a result, the 1K sense amplifiers SA corresponding to the array AR5 are activated.

Similarly, when the column address timing signal CAT is activated after a predetermined period has elapsed following the activation of the segment address timing signal SAT, the column decoder CD activates one of the column selection lines CSL1 to CSL64 in response to the column address signal CA. Then, 16 bits of data are output.

Thereafter, when a bank pre-charge command is received, data that have been read are restored in the memory cell MC, and the bit line pairs BL are pre-charged. Specifically, when a write enable signal (not shown) and the row address strobe signal RAS are activated, and when a bank address signal for the selected bank BNK0 is received, the main row decoder MRD deactivates the main word line MWL1, and also deactivates the block enable signals BLKE0, BLKE1, BLKE4 and BLKE5. Further, the segment row decoder SRD0 deactivates the global segment selection signal GS00 and GS02 and the local segment selection signals LS0 and LS02, and accordingly, deactivates the segment word lines SWL0 and SWL2. After the segment row decoder SRD0 has deactivated the segment word lines SWL0 and SWL2, the sense amplifier enable signals SE0, SE1, SE4 and SE5 are also deactivated. Finally, the bit line pairs BL are pre-charged.

As shown in FIG. 2, since the four main word lines MWL1, MWL5, MWL9 and MWL13 are activated by the main row decoder MRD, 16 arrays AR1 to AR16 can be accessed, and the page length becomes equivalent to 1K word. However, only the 1K sense amplifiers SA corresponding to one array (AR1 in FIG. 2) are activated. Therefore, compared with the conventional example wherein 16K sense amplifiers are activated, the active current can be reduced to 1/16. Here, the 16 arrays AR1 to AR16 which can be accessed are selected to access in response to a row address signal RA, but one of 16 arrays AR by which the sense amplifiers SA is activated is selected in response to the segment address signal SGA. The row address signal RA is fetched in response to the row address strobe signal RAS, but the segment address signal SGA is fetched together with the column address signal CA, in response to the column address strobe signal CAS.

Since the present invention adopts the divided word line structure, even when the main row decoder MRD has activated four main word lines MWL1, MWL5, MWL9 and MWL13, 16-bits data corresponding to the activated main word lines are not read by the bit line pairs BL. But the segment row decoder SRD0 activates only the four segment word lines SWL0 in the selected array AR1, and only 1K-bit data corresponding to the activated segment word lines are read by the bit line pairs BL. Therefore, even if the sense amplifiers SA corresponding to the other fifteen unselected arrays AR2 to AR16 are not activated, the remaining 15-Kb data will not be destroyed.

Furthermore, in the case in which the array AR5 in the same bank BNK0 is to be accessed sequentially after the array AR1 is accessed, the 1K sense amplifiers SA corresponding to the array AR5 are activated, while the 1K sense amplifiers SA corresponding to the array AR1 are maintained in the activated state. Similarly, in the case in which the other arrays AR2 to AR4 and AR6 to AR16 are to be accessed, the 1K sense amplifiers SA corresponding to the corresponding array are additionally activated for each access.

When the main word lines MWL are activated, the 1K sense amplifiers SA can be activated each time, up to a maximum of 16 K, so that the page length is a 1K word length as in the conventional example. Therefore, when the burst operation for sequentially reading and writing a plurality of words is repeated two times or more, the operation can be realized in a similar way to the conventional one. The burst length can be designated for a mode register, and for example, a length of two words, four words or eight words can be set. In this embodiment, four words are set for the mode register, and a burst operation for four words is repeated two times.

Further, in the case in which the array AR1 in the bank BNK0 is accessed and another bank BNK1 to BNK3 is to be sequentially accessed, the main word lines MWL, the segment word lines SWL and the sense amplifiers SA are maintained active, so long as the bank BNK0 is pre-charged. In the case in which the different bank BNK1 to BNK3 is accessed and thereafter the BNK0 is to be accessed again. For example, if the array AR8 in the bank BNK0 is to be accessed, the 1K sense amplifiers SA corresponding to array AR8 are also activated. In the case in which the array AR1 in the bank BNK0 is to be accessed again, the 1K sense amplifiers SA for the array AR1 are already activated, so that data latched from these sense amplifiers SA can simply be read. Therefore, the bank interleave operation for alternately accessing different banks can also be performed.

The preloading and pre-fetching method disclosed in Japanese Unexamined Patent Publication (Kokai) No. 2000-195253 may be adopted for manipulation of arrays. In this case, during a writing process, a selected array is pre-charged immediately after all data equivalent to a burst length are collectively written, and during a reading process, a selected array is pre-charged immediately after all data equivalent to a burst length are pre-fetched. While four main word lines MWL are maintained activated, these lines are continuously being accessed, and are restored in accordance with a bank pre-charge command.

As described above, since the segment word lines SWL are selected in response to the segment address signal SGA in order to read data, it can be said that substantially adequate access time, including time for activating the segment word lines SWL, should be entered in the CAS latency. However, the CAS latency of the low current SDRAM is 26 ns, which is lower than the CAS latency (15 ns) of the general purpose SDRAM. This is because a slow clock signal CLK is employed to reduce the active current, and the CAS latency of 15 ns provided by the general SDRAM can be obtained by using the low current SDRAM.

Furthermore, the operation speed of the arrays is increased since the segment row decoder SRD activates segment word lines SWL in response to the segment address signal SGA after the main row decoder MRD has activated the main word lines MWL, because the segment word lines SWL are short, and because the sense amplifier enable signal lines are short. Therefore, while it requires a little time for activating the arrays, accessing is enabled within the CAS latency (26 ns) of the low current SDRAM, including the CAS latency (15 ns) of the general purpose SDRAM. As described above, when SDRAM 10 of this embodiment is used with a common memory controller, it can provide a low current by using the same interface as the conventional low current SDRAM.

When SDRAM 10 for this embodiment is designed for a special purpose, regardless of whether a conventional interface is used, a greater improvement in performance can be expected. For the SDRAM, the row address is fetched in response to the row address strobe signal RAS. In this embodiment, since an array is not activated before the column address strobe signal CAS is provided, tRCD (delay time from RAS to CAS) can be considerably shorter than that for the general SDRAM. Therefore, even when the CAS latency has a surplus, tRAS (bank cycle time required for the RAS) can be reduced. For example, when a tRCD latency of 3 ns, a CAS latency of 3 ns and a clock access time of 6 ns are defined at a clock frequency of 100 MHz, tRAS is 56 ns. However, when a tRCD latency of 1 ns and a CAS latency of 4 ns are employed, the tRAS becomes faster, i.e., 46 ns. Furthermore, when the RAS/CAS system for the SDRAM is not employed, and instead, a method is employed like the PSRAM, whereby all the addresses are received at one time, in accordance with an access command, the operating speed can more easily be increased.

In this embodiment, without activating many access amplifiers as in the conventional example, a current can be considerably reduced, while still maintaining the conventional functions and performance, such as column accessing in the same bank and bank interleaving. Since only 1/16 of the arrays are activated, as compared with the conventional case, the active current can be considerably reduced, as can the peak current. Therefore, use of the SDRAM is preferable for battery powered operation.

Further, 1K is explained by way of an example of the number of sense amplifiers to be activated at a time, and this is because with the assumption of 16 I/Os and a maximum burst length=eight, one-bit data can be read per 8-bit line pairs by the 1K sense amplifiers. Since one-bit data per 4-bit line pairs can also be read, 512 sense amplifiers may be activated at a time. In this case, the active current can be reduced to 1/32, compared with the conventional case.

Conventionally, when the arrays are activated once, a very large peak current occurs at that time, but when column access time is longer, the average active current is reduced. When the number of arrays to be activated is 16 times that of the present embodiment, and when the 16 column accesses are continuously performed, the average active current becomes the same. However, in actual operations, the 16 column accesses are not continuously performed, and in many cases, SDRAM 10 of the present embodiment largely reduces the active current when compared with the conventional example.

Further, conventionally, a large peak current flows for each row access, and therefore, a large peak current continuously flows upon the continuous activation of a plurality of banks. However, SDRAM 10 in the present embodiment realizes a stable operation because the same small peak current flows for any access.

The present invention has been described with respect to the embodiments, but the above embodiment is merely an example for carrying out the present invention. Therefore, the present invention is not limited to the embodiment, and the present invention can be variously modified without departing from the technical scope of the invention.

The invention claimed is:

1. A semiconductor storage device comprising:
a plurality of arrays, each of the arrays having a plurality of memory cells arranged in rows and columns, a plurality of segment word lines, and a plurality of bit line pairs;
a plurality of I/O line pairs;
a plurality of main word lines arranged across the arrays;
a main row decoder for activating main word lines in response to a row address signal;
a plurality of sense amplifier groups corresponding to the plurality of arrays, and connected to the bit line pairs of the corresponding arrays;
a partial activation means for selecting one of the arrays in response to a segment address signal received together with a column address signal, and for activating a sense amplifier group corresponding to the selected array; and
a column decoder for connecting the bit line pair to the I/O line pair in response to the column address signal.

2. The semiconductor storage device according to claim 1, wherein during a period in which the main row decoder is activating the main word lines, the partial activation means selects a first array from the arrays in response to a first segment address signal;
activates a sense amplifier group corresponding to the selected first array;
selects a second array which differs from the first array in response to a second segment address signal that is different from the first segment address signal; and
activates a sense amplifier group corresponding to the selected second array.

3. The semiconductor storage device according to claim 1, wherein the main row decoder deactivates the main word lines in response to a pre-charge command; and
the partial activation means terminates the selection of an array and the activation of a sense amplifier group in response to the pre-charge command.

4. The semiconductor storage device according to claim 1, further comprising:
an address buffer for fetching an externally input address signal as a row address signal in response to a row address strobe signal, or fetching an externally input address signal as a column address signal and a segment address signal in response to a column address strobe signal; and
a column address timing control circuit for providing the segment address signal fetched from the address buffer to the partial activation means, and providing the column address signal fetched from the address buffer to the column decoder.

5. The semiconductor storage device according to claim 1, wherein the partial activation means comprises:
a segment row decoder for activating the segment word lines in response to the segment address signal; and
a sense amplifier control means for activating a sense amplifier group corresponding to an array which comprises the segment word lines activated by the segment row decoder.

6. A semiconductor storage device comprising:
a plurality of banks; and
a bank selection means for selecting one of the banks in response to a bank address signal,
wherein each of the banks comprises
a plurality of arrays, each of the arrays having a plurality of memory cells arranged in rows and columns, a plurality of segment word lines and a plurality of bit line pairs;
a plurality of I/O line pairs;
a plurality of main word lines arranged across the arrays;
a main row decoder for activating the main word lines in response to a row address signal;
a plurality of sense amplifier groups corresponding to the plurality of arrays and connected to the bit line pairs of the corresponding arrays;
a partial activation means for selecting one of the arrays in response to a segment address signal received together with a column address signal, and activating a sense amplifier group corresponding to the selected array; and
a column decoder for connecting the bit line pairs to the I/O line pairs in response to the column address signal.

7. The semiconductor storage device according to claim 6, wherein during a period in which the bank selection means selects a second bank and then again selects a first bank, the main row decoder in the first bank selected by the bank selection means maintains the main word lines in the activated state.

8. The semiconductor storage device according to claim 6, wherein the main row decoder deactivates main word lines in response to a pre-charge command; and
the partial activation means terminates the selection of an array and the activation of a sense amplifier group in response to the pre-charge command.

9. The semiconductor storage device according to claim 6, further comprising:
an address buffer for fetching an externally input address signal as a bank address signal and a row address signal in response to a row address strobe signal, or fetching an externally input address signal as a column address signal and a segment address signal in response to a column address strobe signal; and
a column address timing control circuit for providing the segment address signal fetched from the address buffer to the partial activation means, and providing the column address signal fetched from the address buffer to the column decoder.

10. The semiconductor storage device according to claim 6, wherein the partial activation means comprises:
a segment row decoder for activating the segment word lines in response to the segment address signal; and
a sense amplifier control means for activating a sense amplifier group corresponding to an array which comprises the segment word lines activated by the segment row decoder.

* * * * *